United States Patent [19]

Usami et al.

[11] Patent Number: 4,529,681
[45] Date of Patent: Jul. 16, 1985

[54] LIGHT- AND HEAT-SENSITIVE RECORDING MATERIAL

[75] Inventors: Toshimasa Usami; Toshiharu Tanaka, both of Shizuoka; Masato Satomura, Kanagawa, all of Japan

[73] Assignee: Fuji Photo Film Co., Ltd., Kanagawa, Japan

[21] Appl. No.: 552,892

[22] Filed: Nov. 17, 1983

[30] Foreign Application Priority Data

Nov. 17, 1982 [JP] Japan .................................. 57-201743

[51] Int. Cl.³ .............................................. G03C 1/48
[52] U.S. Cl. .................................... 430/138; 430/177; 430/179; 430/151; 430/292; 430/281; 430/176; 430/285; 430/286; 430/287; 430/288; 430/336; 430/337; 430/338
[58] Field of Search ............... 430/177, 179, 151, 292, 430/281, 176, 285–288, 336, 337, 338, 138

[56] References Cited

U.S. PATENT DOCUMENTS

| | | | |
|---|---|---|---|
| 3,219,446 | 11/1965 | Berman | 430/138 |
| 3,276,869 | 10/1966 | McCune | 430/138 |
| 3,281,244 | 10/1966 | Endermann et al. | 430/138 |
| 3,922,283 | 11/1975 | Yahagi et al. | 430/138 |
| 4,065,315 | 12/1977 | Yamazaki et al. | 430/275 |
| 4,251,619 | 2/1981 | Kurita | 430/292 |
| 4,343,885 | 8/1982 | Reardon | 430/338 |

*Primary Examiner*—Won H. Louie
*Attorney, Agent, or Firm*—Sughrue, Mion, Zinn, Macpeak, and Seas

[57] ABSTRACT

A light- and heat-sensitive recording material is disclosed. The material include microcapsule in which are encapsulated a particular combination comprised of a vinyl compound, a photopolymerization initiator, and a color forming component being capable of undergoing a color reaction with another color forming component to cause color formation. These coloring components are provided on the same side of a support.

22 Claims, No Drawings

LIGHT- AND HEAT-SENSITIVE RECORDING MATERIAL

FIELD OF THE INVENTION

The present invention relates to a recording material and more particularly, to a light- and heat-sensitive recording material in which capsules containing a particular combination as a core material are used.

BACKGROUND OF THE INVENTION

Much research has been conducted to develop recording systems utilizing capsules, and various systems such as a pressure sensitive recording system, a heat-sensitive recording system and so on have already been invented. A number of patents concern such recording systems are disclosed, for example, in U.S. Pat. Nos. 2,712,507; 2,730,456; 2,730,457; 3,418,250; 3,432,327: and so on.

These conventional techniques can only make records corresponding to applied pressure or heat. Such techniques cannot make records corresponding to applied light. The present inventors have studied the above-described defect in conventional techniques, and have searched for a system which can provide an recorded image corresponding to applied heat and light.

SUMMARY OF THE INVENTION

Therefore, an object of the present invention is to provide a recording material which causes color formation in its unexposed area by imagewise exposure and heating subsequent thereto.

Another object of the present invention is to provide a novel light- and heat-sensitive recording material which is stabilized to light in its background part by thermal printing and uniform exposure subsequent thereto.

As the result of our various examinations, it has been found that recording utilizing color reaction is feasible without rupturing capsules by pressure application, though in conventional recording materials using capsules coloration recording is carried out by reacting one coloring component incorporated in capsules with the other coloring component present outside the capsules through the rupture of capsule walls caused by applied pressure.

The above-described objects of the present invention are attained with a light- and heat-sensitive recording material in which both capsules containing a vinyl compound, a photo polymerization initiator and one component capable of causing color reaction, and the other component capable of causing color formation by reacting with the above-described component are coated on the same side of a support.

DETAILED DESCRIPTION OF THE INVENTION

The light- and heat-sensitive recording material of the present invention is stable during normal handling and under general conditions, but if exposed to light, it is hardened through polymerization of the vinyl compound incorporated in capsules. As a result of the hardening, it becomes impossible for the coloring component contained in the cores of capsules present in exposed areas to ooze out of the capsules and at the same time, for the other component to take part in the color reaction, which is present outside the capsules, to penetrate into the capsules even though heat is applied thereto. Consequently, by heating, color formation is caused only in the unexposed areas.

On the other hand, if the light- and heat-sensitive recording material of the present invention is heated without being exposed to light, one coloring component contained in the core of individual capsules passes through the capsule wall and oozes out, or the other coloring component present outside the capsules passes through the capsule wall and permeates into the inside of individual capsules. Whether in the former case or in the latter case, color formation takes place. Accordingly, forming color can be caused by heating in the heated area. It is also feasible to prevent coloration at areas where color formation has not yet occurred by over all exposure subsequent to the heating processing (such a step is called a "fixing step").

Vinyl compounds to be used in the present invention include those which contain one or more of, preferably a plurality of, a vinyl or a vinylidene group and more specifically, those which contain an acryloyl group, a methacryloyl group, an allyl group, an unsaturated polyester group, a vinyloxy group, an acrylamido group or the like. The most representative vinyl compounds are reaction products of polyols, polyamines, aminoalcohols or the like with unsaturated carboxylic acids, reaction products of hydroxy group-containing acrylates or methacrylates with polyisocyanates, and so on.

Specific examples of the typical representatives of the vinyl compounds include polyethylene glycol diacrylate, propylene glycol dimethacrylate, pentaerythritol triacrylate, trimethylolpropane diacrylate, trimethylolpropane triacrylate, pentaerythritol tetraacrylate, hexanediol diacrylate, 1,2-butanediol diacrylate, tetrakis-$\beta$-acryloxyethylethylenediamine, a reaction product of epoxy resin with acrylic acid, a reaction product of methacrylic acid, pentaerythritol and acrylic acid, a condensation product of maleic acid, diethylene glycol and acrylic acid, methylmethacrylate, butylmethacrylate, styrene, divinyl benzene, diallylnaphthalene and so on. These compounds can be used in combination of two or more thereof depending on the enduse purpose of the recording material to be produced. The above-described viny compounds are used in the capsule in a concentration of about 10 to 90 wt % and applied in an amount of about 1 to 10 g/m$^2$.

The term "photopolymerization initiator" as used in the present invention includes organic and inorganic compounds of the kind which have such an ability as to make the vinyl compounds initiate a polymerization reaction when exposed to light. Such compounds may be used independently or in a combination of two or more thereof.

Materials therefor have already been described in detail in books. For example, they are disclosed in Kosar, *Light Sensitive Systems*, John Wiley & Sons; Warashina et al., *Kankosei Jushi* (which means "light sensitive resin"), Nikkan Kogyo Shinbunsha; Tsunoda et al., *Kankosei Jushi*, Insatsu Gakkai; and so on.

Representatives of materials for the photo polymerization initiator, mention may be made of aromatic ketones, quinone compounds, ether compounds and nitro compounds.

Specific examples of such compounds include benzoquinone, phenanthrene quinone, naphthoquinone, diisopropyl phenanthrenequinone, benzoyl butyl ether, benzoin, furoin butyl ether, Michler's ketone, Michler's thioketone, tetraphenyl lophine dimer, fluorenone, trinitrofluorenone, β-benzoylaminonaphthalene and so on.

These compounds are added in a proportion of 0.1 wt % to 30 wt % preferably 0.5 to 15 wt %, based on 100 wt % of the vinyl compound used, and they are applied in an amount of about 0.1 to 5 g/m².

The term "color reaction" as used in the present invention describes one which can provide a coloring agent through an acid-base reaction, a redox reaction, a coupling reaction or a chelate-forming reaction.

Especially effective color reactions used in connection with the present invention, include a coupling reaction in which a diazo compound, a coupling component and a coloring assistant are employed as elements for effecting color reaction, and a coupling reaction using a combination of a color forming agent (color former) called a leuco dye with a color developing agent (color developer).

Diazo compounds which can be used in the coupling reaction of the present invention are diazonium salts represented by the general formula, $ArN_2^+X^-$ (wherein Ar represents a substituted or an unsubstituted aromatic moiety, $N_2^+$ represents a diazonium group, and $X^-$ represents an acid anion). The diazo compounds effect the coupling reaction with one or more coupling components and one or more coloring assistants to form the coloration and they are decomposed by light.

Suitable examples of the diazo compounds which can form a salt include 4-diazo-1-dimethylaminobenzene, 4-diazo-1-dimethylaminobenzene, 4-diazo-1-dipropylaminobenzene, 4-diazo-1-methylbenzylaminobenzene, 4-diazo-1-dibenzylaminobenzene, 4-diazo-1-ethylhydroxyethylaminobenzene, 4-diazo-1-diethylamino-3-methoxybenzene, 4-diazo-1-dimethylamino-2-methylbenzene, 4-diazo-1-benzoylamino-2,5-diethoxybenzene, 4-diazo-1-morpholinobenzene, 4-diazo-1-morpholino-2,5-dimethoxybenzene, 4-diazo-1-morpholino-2,5-dibutoxybenzene, 4-diazo-1-anilinobenzene, 4-diazo-1-toluylmercapto-2,5-diethoxybenzene, 4-diazo-1,4-methoxybenzoylamino-2,5-diethoxybenzene and the like.

Suitable examples of the acid anion include $C_nF_{2n+1}COO^-$ (n: 3 to 9), $C_mF_{2m+1}SO_3^-$ (m: 2 to 8), $(C_lF_{2l+1}SO_2)_2CH^-$ (l: 1 to 18),

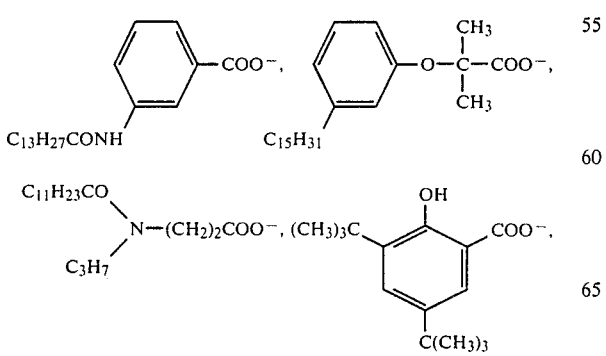

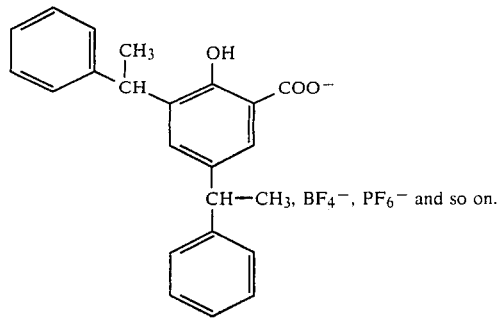

Specific examples of the diazo compounds (diazonium salt) are illustrated below:

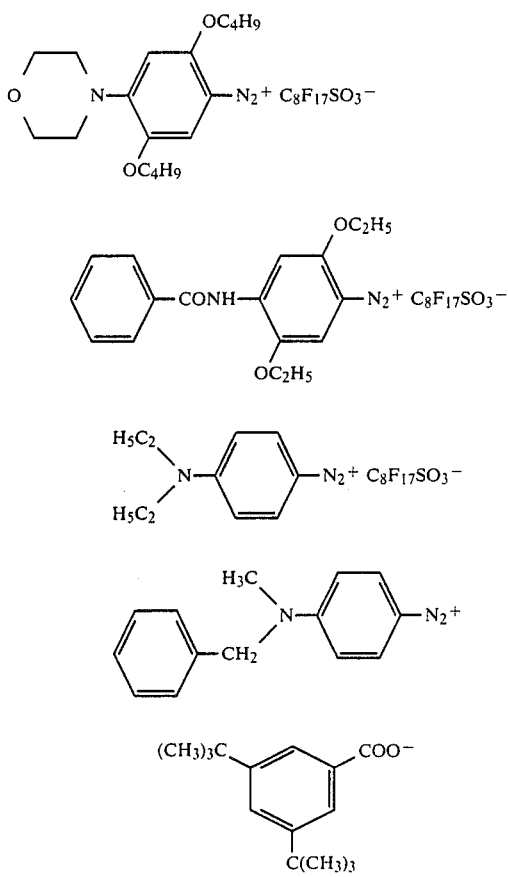

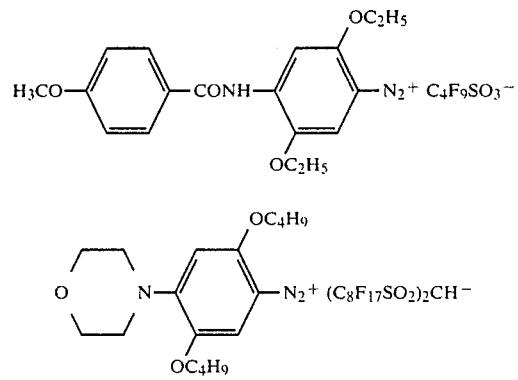

-continued

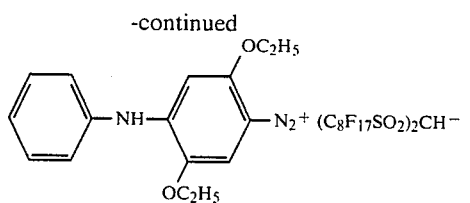

These diazo compounds are used in an amount of about 0.05 to 2.0 g/m².

Coupling components which can be used in the coupling reaction of the present invention are those which can form dyes by coupling with diazo compounds (diazonium salts) under a basic atmosphere, with specific examples including resorcinol, phloroglucinol, sodium 2,3-dihydroxynaphthalene-6-sulfonate, 1-hydroxy-2-naphthoic acid morpholinopropylamide, 1,5-dihydroxynaphthalene, 2,3-dihydroxynaphthalene, 2,3-dihydroxy-6-sulfanylnaphthalene, 2-hydroxy-3-naphthoic acid morpholinopropylamide, 2-hydroxy-3-naphthoic acid anilide, 2-hydroxy-3-naphthoic acid 2'-methylanilide, 2-hydroxy-3-naphthoic acid ethanolamide, 2-hydroxy-3-naphthoic acid octylamide, 2-hydroxy-3-naphthoic acid N-dodecyloxy-propylamide, 2-hydroxy-3-naphthoic acid tetradecylamide, acetoanilide, acetoacetoanilide, benzoylacetoanilide, 1-phenyl-3-methyl-5-pyrazolone, 1-(2',4',6'-trichlorophenyl)-3-benzamido-5-pyrazolone, 1-(2',4',6'-trichlorophenyl)-3-anilino-5-pyrazolone, 1-phynyl-3-phenylacetoamido-5-pyrazolone and the like. Further, these coupling components can be used in a combination of two or more thereof to provide an image of desired color tone. These coupling components are used in an amount of about 0.1 to 6.0 g/m².

Coloring assistants which can be used in the coupling reaction of the present invention include basic substances which are slightly soluble or insoluble in water, and substances capable of generating alkaline compounds on heating.

Suitable examples of useful coloring assistants include inorganic and organic ammonium salts, organic amines, amides, urea, thiourea and their derivatives, thiazoles, pyrroles, pyrimidines, piperazines, guanidines, indoles, imidazoles, imidazolines, triazoles, morpholines, piperidines, amidines, formamidines, pyridines and like nitrogen-containing compounds. Specific examples of these compounds include ammonium acetate, tricyclohexylamine, tribenzylamine, octadecylbenzylamine, stearylamine, allylurea, thiourea, methylthiourea, allylthiourea, ethylenethiourea, 2-benzylimidazole, 4-phenylimidazole, 2-phenyl-4-methyl-imidazole, 2-undecyl-imidazole, 2,4,5-trifuryl-2-imidazoline, 1,2-diphenyl-4,4-dimethyl-2-imidazoline, 2-phenyl-2-imidazoline, 1,2,3-triphenylguanidine, 1,2-ditolylguanidine, 1,2-dicyclohexylguanidine, 1,2,3-tricyclohexylguanidine, guanidine trichloroacetate, N,N'-dibenzylpiperazine, 4,4'-dithiomorpholine, morpholinium trichloroacetate, 2-amino-benzothiazole and 2-benzoylhydrazino-benzothiazole. These coloring assistants may be used in a combination of two or more thereof. Further, these coloring assistants are used in an amount of 0.1 to 6.0 g/m².

The color former called a leuco dye which gan be advantageously employed in the present invention includes compounds which are capable of forming a color by donating an electron or accepting a proton such as acid and more particularly, those which are colorless under an ordinary condition, and contain as their partial skeleton lactone, lactum, sultone, spiropyran, ester, amido or so on which can undergo ring opening or bond fission when allowed to come into contact with a color developer, though the color forming agent is not restricted to such particular ones. Specific examples of the color former include Crystal Violet lactone, benzoyl leuco Methylene Blue, Malachite Green lactone, Rhodamine B lactone, 1,3,3-trimethyl-6'-ethyl-8'-butoxyindolinobenzospiropyran and so on.

Useful color developers to be used in combination with the color formers include phenol compounds, organic acids or the metal salts thereof, hydroxybenzoic acid ester, clay, etc. Particularly desirable color developer are phenol compounds and organic acids which each is slightly soluble in water and has a melting point of 50° C. to 250° C., preferably 60° C. to 200° C.

Specific examples of such phenol compounds include 4,4'-isopropylidene-diphenol (bisphenol A), p-tert-butylphenol, 2,4-dinitrophenol, 3,4-dichlorophenol, 4,4'-methylene-bis(2,6-di-tert-butylphenol), p-phenylphenol, 4,4-cyclohexylidenediphenol, 2,2'-methylenebis(4-tert-butylphenol), 2,2'-methylenebis(α-phenyl-p-cresol)thiodiphenol, 4,4'-thiobis(6-tert-butyl-m-cresol), sulfonyldiphenol, 1,1-bis(4-hydroxyphenyl)n-dodecane, 4,4-bis(4-hydroxyphenyl)-1-pentanic acid ethyl ester and further, a condensation product of p-tert-butylphenol and formaldehyde, a condensation product of p-phynylphenol and formaldehyde, and so on.

Specific examples of the organic acid or a metal salt which can be advantageously used include 3-tert-butylsalicylic acid, 3,5-di-tert-butylsalicylic acid, 5-α-methylbenzylsalicylic acid, 3,5-di-α-methylbenzylsalicylic acid, 3-tert-octylsalicylic acid, 5-α,γ-dimethyl-α-phenyl-γ-phenylpropylsalicilic acid, and the zinc, lead, aluminium, magnesium and nickel salts thereof and so on.

Specific examples of the hydroxybenzoate include ethyl p-hydroxybenzoic acid ester, butyl p-hydroxybenzoate, heptyl p-hydroxybenzoate, benzyl p-hydroxybenzoate and so on.

In the present invention it is of importance to encapsulate at least one of the combination of the two coloring components to be employed in combination. That is to say, if the color former is encapsulated, the color developer may be copresent in the same layer, or present in the adjacent layer. On the other hand, if the color developer is encapsulated, the color former may be copresent in the same layer, or present in the adjacent layer. In either state, a color image can be formed by heating.

In particular, it is preferable to encapsulate the color former from the standpoint of enhancing coloring efficiency.

In encapsulating such a vinyl compound, a photopolymerization initiator and one of the components capable of undergoing color reaction as described above, a solvent for the core material can be used together therewith. As such a solvent, natural or synthetic oils can be used independently or in combination. Specific examples of such oils include cotton seed oil, kerosene, aliphatic ketones, aliphatic esters, paraffin, naphthalene oil, alkylated biphenyl, alkylated terphenyl, chlorinated paraffin, alkylated naphthalene, diarylethane such as 1-phenyl-1-xylylethane, 1-phenyl-1-p-ethylphenylethane, 1,1'-ditolylethane and the like, and so on.

Further, thermal polymerization inhibitor can be used therein for the purpose of improving preservability. Suitable examples of the thermal polymerization inhibitors include p-methoxyphenol, hydroquinone, t-butylcatechol, pyrogallol, 2-hydroxybenzophenone, 4-methoxy-2-hydroxybenzophenone, cuprous chloride, phenothiazine, chloranil, naphthylamine, β-naphthol, 2,5-di-t-butyl-p-cresol, nitrobenzene, dinitrobenzene, picric acid, p-toluidine, and the like. Further, these thermal polymerization inhibitors are used in an amount of abou 1 g/m$^2$ or less.

The component capable of causing a color reaction is used in the capsule in a concentration of about 0.1 to 50 wt %, preferably 5 to 30 wt %. If the color forming component content is less than 0.1 wt % or less, the color density is reduced, and if the content is more than 30 wt %, the encapsulation becomes difficult.

As materials for forming capsule walls which can provide especially good results, polyamide, polycarbonate, polyurea, polyurethane and polyester or mixtures of two or more thereof are preferably used.

Though hydrophilic polymers such as gelatin, polyvinyl pyrrolidone, polyvinyl alcohol and the like may also be utilized, they are insufficient with respect to preservability.

Especially good capsule walls can be formed when a method of utilizing deposition of polymer and a method of encapsulating using polymerization of reactant supplied from the inside of oily droplets are employed. That is, when such methods are employed, capsules desirable for a recording material, more specifically having a uniform size and excellent keeping quality due to their dense walls, can be formed in a short time.

The above-described methods and specific examples of compounds usable therein are described in U.S. Pat. Nos. 3,726,804 and 3,796,669 (incorporated herein by reference to disclose such methods and compounds).

For example, when polyurethane is to be employed as a material for the capsule wall, a polyisocyanate and a second material capable of forming the capsule wall by reacting therewith (e.g., polyol) are admixed with an oily liquid to be encapsulated. The resulting mixture is then dispersed in water in the form of an emulsion and the temperature of the emulsion is increased to cause a high polymer producing reaction at the individual surfaces of the oil droplets and thereby, to form the capsule wall. At this time, an assistant solvent having a low boiling point and a strong dissolving power can be used in the oily liquid.

As the polyisocyanates, and the polyols and the polyamines, which are the other party in the high polymer producing reaction, which can be employed in the above-described case, there are included those which disclosed in U.S. Pat. Nos. 3,135,716; 3,281,383; 3,468,922; 3,775,695 and 3,793,268: Japanese Patent Publication Nos. 40347/'72 and 24159/'74: and Japanese Patent Publication (unexamined) Nos. 80191/'73 and 84086/'73.

In addition, tin salts which can accelerate the urethanating reaction can be used together with the above-described compounds.

At the time of encapsulating, water soluble high polymers can be used. The expression "water soluble high polymer" is intended herein to include water soluble anionic, nonionic and amphoteric high polymers. As examples of the anionic high polymers, mention may be made of both natural and synthetic ones containing a —COO$^-$ group, —SO$_3^-$ group or the like. More specifically, suitable examples of anionic natural high polymers include gum arabic, alginic acid and so on, and suitable examples of semi-synthetic products include carboxymethylcellulose, phthaloylated gelatin, sulfated starch, sulfated cellulose, lignin sulfonate and so on.

Further, suitable examples of synthetic products of the anionic high polymers include copolymers of maleic anhydride type (including hydrolysis products thereof), homo- and co-polymers of acrylic acid type (including those of methacrylic acid type), homo- and co-polymers of vinylbenzene sulfonate type, carboxy denatured polyvinyl alcohol, and so on.

Useful amphoteric high polymers include gelatin and the like.

The size of the capsules is adjusted to 20μ or less, preferably 0.5 to 8μ. If the size is increased beyond 20μ, the quality of printed letters is generally apt to be deteriorated.

On the occasion that heating by means of a thermal head is carried out on the coated layer side, it is desirable for the capsule size to be 8μ or less in order to avoid pressure marks.

A process for preparing the solution of the coloring component to be present outside the microcapsules comprises throwing the coloring component into an aqueous solution of a water soluble high polymer in such an amount that its concentration may become 5 to 40 wt % (on a solid basis), and dispersing the coloring component into the aqueous solution by means of a ball mill, a sand mill, an attritor, a colloid mill or the like to make the coloring component fine grains.

A desirable size of the resulting fine grain is 10μ or less, particularly 2μ or less.

The water soluble high polymers to be used as the dispersing medium of the above-described dispersion may be the same as those used for forming the microcapsules.

The liquid containing the microcapsules and the liquid in which the coloring component to be present outside the microcapsules is dispersed are coated on a support separately, or in the form of a mixture.

The coverage of the color forming component (on a solid basis) is 0.05 to 1.5 g/m$^2$, preferably 0.05 to 0.4 g/m$^2$, while the coverage of the color developer (on a solid basis ) is 0.5 to 4.0 g/m$^2$, preferably 0.5 to 2.0 g/m$^2$.

It is proposed in Japanese Patent Publication (unexamined) No. 125354/'81 that in a heat-sensitive recording paper a coating of a water soluble high polymer is provided on its heat-sensitive coloring layer for the purpose of improvement in discoloration resistance. By taking advantage of this proposal, resisting properties to various kinds of chemical agents or oils can also be imparted to the recording material of this invention.

Suitable examples of supports which can be used include plastic films, synthetic paper, laminated paper, an aluminium plate, paper, neutralized papaer, surface sized paper and so on.

When coating the support, a binder such as PVA, hydroxyethylcellulose or latex, a protective agent such as starch grains, and so on are used. Examples of various additives include binders, oxidation inhibitors, smudge inhibitors and surface active agents which have been used in conventional recording systems, their coating methods, their usage and so on are well known and disclosed in, e.g., U.S. Pat. Nos. 2,711,375 and 3,625,736: British Pat. No. 1,232,347: Japanese Patent Publication (unexamined) Nos. 44012/'75, 50112/'75, 127718/'75 and 30615/'75: U.S. Pat. Nos. 3,836,383 and 3,846,331: and so on. These methods can be utilized in the present invention also.

Various coating methods, such as an air knife coating method, a blade coating method, a bar coating method, a curtain coating method and so on can also be employed in the present invention.

As an especially desirable example of the compounds and the constitution which can be employed in the recording material of the present invention, mention may be made of the embodiment in which the following requisites are synthesized:

(1) a phenol compound or an organic acid or the metal salts thereof which is slightly soluble in water and has a melting point of 50° to 200° C. is employed as a color developer, and dispersed into an aqueous solution of polyvinyl alcohol in a state of solid.

(2) capsules having a size of 8μ or less are formed in an aqueous solution of polyvinyl alcohol using polyurethane as a capsule wall material.

(3) a core material of the capsules which satisfy the above-described requisite (2) comprised of at least a vinyl compound, a photopolymerization initiator and a leuco dye as the coloring component.

(4) a binder is added at the time of preparing the dispersion of the color developer (the requisite (1)) and at the time of encapsulating (the requisite (2)).

(5) the dispersion of the color developer (the requisite (1)) and the capsules (the requisite (2)) are coated on a support separately or in the form of a mixture.

(6) as the support in the requisite (5), paper is employed.

The present invention will now be illustrated in more detail by reference to the following examples. However, the present invention should not be construed as being limited to the following examples in any way. Additionally, in the following examples, all parts are by weight unless otherwise indicated.

EXAMPLE 1

| Coating Composition: | Parts |
| --- | --- |
| 3,5-Di-α-methylbenzylsalicylic acid | 20 |
| Polyvinyl Alcohol | 5 |
| Water | 100 |

The above-described composition was dispersed for 24 hours by means of a sand mill to obtain a dispersion of 3,5-di-α-dimethylbenzylsalicylic acid which had a mean grain size of 3μ. This dispersion was coated on neutralised paper having a basis weight of 43 g/m² at a coverage of 4 g/m² on a basis of solid using a bar coating method wherein the coating rod 12 was utilized. Drying of the coated dispersion was carried out at 90° C. for 10 minutes.

On the other hand, 9 parts of pentaerythritol tetraacrylate, 1.5 parts of ethyl acetate, 0.5 part of methyl cellosolve, 0.5 part of Crystal Violet lactone, 3 parts of 1-phenyl-1-xylylethane, 0.3 part of benzoisobutyl, 0.7 part of the adduct of tolylenediisocyanate and trimethylolpropane (mol ratio of 3:1) and 0.2 part of the adduct of ethylenediamine and propylene oxide (mol ratio of 1:4) were admixed and dissolved in a dark room.

The thus obtained solution was added to a solution containing 2.6 parts of polyvinyl alcohol dissolved in 29 parts of water and subjected to an emulsifying dispersion treatment at 20° C. to obtain droplets having a mean size of 5μ. After the completion of emulsification, 100 parts of water was then added to the emulsion. The resulting emulsion was heated to 50° to 70° C. for 2 hours with stirring to produce capsules.

To the thus obtained capsule solution, 2 parts of 48% SBR latex was added to prepare a coating composition. This coating composition was coated on the above-described coated layer using the coating rod 38 according to a bar coating method, and dried at 45° C. for 30 minutes to obtain a recording material.

This sheet was exposed for 3 minutes by means of a high pressure mercury arc lamp of 400 W placed at a distance of 25 cm through a line original. Then, it was subjected to heat development by being made to come into contact with a hot plate at 130° C. for 2 seconds. Thus, a clear blue image corresponding to the unexposed area was obtained. Image density was determined by measuring the blue density of the image with a Macbeth RD-514 type reflex densitometer. It was 0.9.

On the other hand, the same recording material as used above was firstly made to come into contact with a hot stamp at 120° C. for 1 second to produce a blue image and then, it was exposed for 20 seconds by means of a high pressure mercury arc lamp of 400 W placed at a distance of 2 cm. Even when heated again at 130° C. for 10 seconds, the resulting sheet caused substantially no coloration in its background area. Therefore, it was apparent that fixation was effected.

EXAMPLE 2

A dispersion of a color developing agent was prepared as follows:

| Composition of Dispersion: | Parts |
| --- | --- |
| 1,1'-Bis(4-hydroxyphenyl)-n-dodecane | 20 |
| Polyvinyl Alcohol | 5 |
| Water | 100 |

The above-described composition was dispersed for 24 hours by means of a sand mill to obtain a dispersion having a mean grain size of 3μ.

A capsule solution of a color former was prepared as follows:

In a dark room, 9 parts of trimethylolpropane triacrylate, 1.5 parts of ethyl acetate, 0.5 part of methyl cellosolve, 0.5 part of Crystal Violet lactone, 3 parts of 1-phenyl-1-xylylethane, 0.3 part of benzoisobutyl, 0.7 part of an adduct of tolylenediisocyanate and trimethylol propane (mol ratio of 3:1) and 0.2 part of an adduct of ethylenediamine and propylene oxide (mol ratio of 1:4) were admixed with one another and dissolved.

The thus prepared solution was added to a solution containing 2.6 parts of polyvinyl alcohol dissolved in 29 parts of water, and subjected to an emulsifying dispersion treatment at 20° C. so as to have a mean droplet size of 5μ. At the conclusion of emulsification, 100 parts of water was, then, added to the emulsion formed. The resulting emulsion was heated to 50° to 70° C. for 2 hours with stirring to produce capsules.

A 10-part portion of the color developer dispersion, a 5-part portion of the color former capsule solution, and 3 parts of 5% SBR latex were admixed to prepare a coating composition, and coated on a support using the coating rod 24 according to a bar coating method in the similar manner as in Example 1. The resulting coating was dried at 45° C. for 40 minutes to obtain a light- and heat-sensitive recording material.

This sheet was exposed for 3 minutes through a line original by means of a high pressure mercury arc lamp of 400 W placed at a distance of 25 cm. Then, it was subjected to heat development by being made to come into contact with a hot plate of 130° C. for 2 seconds. Thus, clear blue image corresponding to the unexposed area was obtained. The blue image density attained was 1.10.

On the other hand, the same recording material as used above was firstly made to come into contact with a hot stamp of 120° C. for 1 second to produce blue image and then, it was exposed for 20 seconds by means of a high pressure mercury arc lamp of 400 W placed at a distance of 2 cm. Even when heated again at 130° C. for 10 seconds, the resulting material caused substantially no coloration in its background area. That is, it was apparent that fixation was effected.

EXAMPLE 3

Using the same steps and under the same conditions as in Example 2 except for changing the color developer to 4,4-bis(4-hydroxyphenyl)-1-pentanic acid ethyl ester, a light- and heat-sensitive recording material was obtained. As for the blue image produced, the same result as in Example 2 was obtained.

EXAMPLE 4

2 g of the diazo compound of the following formula, 0.3 part of benzoin methyl, and 10 parts of an adduct of xylilene diisocyanate and trimethylol propane (mol ratio of 3:1) were dissolved in a mixed solvent containing 20 parts of trimethylolpropane trimethacrylate and 5 parts of dichloromethane:

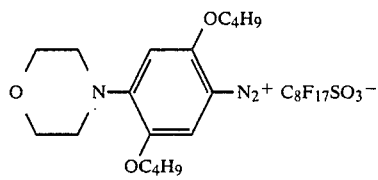

The diazo compound solution obtained was mixed with a solution containing 5.2 parts of polyvinyl alcohol dissolved in 58 parts of water, and subjected to an emulsifying dispersion treatment at 20° C. so as to make an emulsion having a mean droplet size of 3μ. At the conclusion of the emulsification, 100 parts of water was added to the emulsion formed. The resulting emulsion was heated to 40° to 70° C. for 2 hours with stirring to produce a capsule solution.

On the other hand, in order to prepare a dispersion of a coupling component, 20 parts of 2-hydroxy-3-naphthoic acid anilide and 5 parts of polyvinyl alcohol were added to 100 parts of water and dispersed for 24 hours by means of a sand mill. Thus, the coupler dispersion having a mean grain size of about 3μ was obtained.

Further, 20 parts of triphenylguanidine and 5 parts of polyvinyl alcohol were added to 100 parts of water and dispersed for about 24 hours by means of a sand mill to obtain the dispersion of triphenylguanidine having a mean grain size of 3μ.

A 50-part portion of the thus obtained diazo compound capsules, a 15-part portion of the thus obtained coupler dispersion and a 15-part portion of the triphenylguanidine dispersion were added to 20 parts of a 5% zinc stearate solution to prepare a coating composition.

This coating composition solution was coated on high-grade paper (basis weight: 50 g/m$^2$) using the coating rod 32 according to a bar coating method at a dry coverage of 12 g/m$^2$, and dried at 45° C. for 30 minutes to obtain a heat sensitive recording material. Heat recording was carried out on the thus obtained material with a Mitsubishi Melfas 600 (GIII mode) and then, fixation was carried out by subjecting the resulting material to allover exposure with a Ricopy Highstart Model-4 (produced by Ricoh Company Ltd.)

Image density of the thus obtained record was determined by measuring blue density of the image with a Macbeth reflex densitometer, and it was 1.2.

On the other hand, heat recording was carried out again on the fixed area of the recording material. However, no images were recorded and thereby, accomplishment of fixation was confirmed.

Next, for the purpose of examining preservability, the heat sensitive recording material was subjected to a forced deterioration test by being kept in the dark for 24 hours under the condition of 40° C. and 90% RH.

A change in fog was examined by measuring fog densities before and after the forced deterioration test with a Macbeth reflex densitometer. Fog densities measured were 0.09 and 0.13, respectively. From the above-described results, it is apparent that heat sensitive paper which is excellent in preservability and that, can be fixed is obtained.

While the invention has been described in detail and with reference to specific embodiments thereof, it will be apparent to one skilled in the art that various changes and modifications can be made therein without departing from the spirit and scope thereof.

What is claimed is:

1. A light- and heat-sensitive recording material, comprising:
    a support base having on one surface thereof;
    a plurality of microcapsules containing a vinyl compound, a photopolymerization initiator, a first color forming component capable of undergoing a color reaction with a second component to form a color, and a solvent; and said second color forming component, wherein said solvent and said first color forming component are present in the core of said microcapsulates and said second color forming component-is present outside of said microcapsules
    said recording material coloring by heat, and said vinyl compound being caused to polymerize by light, thereby preventing coloration.

2. A light- and heat-sensitive recording material as claimed in claim 1, wherein the vinyl compound contains a group selected from the groups consisting of an acryloyl group, a methacryloyl group, an allyl group, an unsaturated polyester group, a vinyloxy group, and an acrylamido group.

3. A light- and heat-sensitive recording material as claimed in claim 1, wherein the vinyl compound is a reaction product of polyols, polyamines or aminoalcohols with unsaturated carboxylic acids, or a reaction products of hydroxy group-containing acrylates or methacrylates with polyisocyanates.

4. A light- and heat-sensitive recording material as claimed in claim 3, wherein the vinyl compound is present in the capsule in an amount of about 10 to 90 wt %.

5. A light- and heat-sensitive recording material as claimed in claim 1, wherein the photopolymerization initiator is selected from the group consisting of aromatic ketones, quinone compounds, ether compounds and nitro compounds.

6. A light- and heat-sensitive recording material as claimed in claim 5, wherein the photopolymerization initiator is present in an amount of 0.1 wt % to 30 wt % based on 100 percent by weight of the vinyl compound.

7. A light- and heat-sensitive recording material as claimed in claim 1, said coloring forming components are selected from the groups wherein the first color forming component is a color former and the second color forming component is a color developer, or the first color forming component is a diazo compound and the second color forming component is a coupling component.

8. A light- and heat-sensitive recording material as claimed in claim 1 or 7, wherein the first color forming component is present in the microcapsule in a concentration in the range of 0.1 to 50 wt %.

9. A light- and heat-sensitive recording material as claimed in claim 7, wherein the color former is present in an amount of 0.05 to 1.5 g/m² and the color developer is present in an amount in the range of 0.5 to 4.0 g/m².

10. A light- and heat-sensitive recording material as claimed in claim 9, wherein the color former is present in an amount in the range of 0.05 to 0.4 g/m² and the color developer is present in an amount in the range of 0.5 to 2.0 g/m².

11. A process for forming color images in a light- and heat-sensitive recording material which comprises imagewise exposing the recording material to light and uniformly heating to form a color image on the unexposed area, or imagewise heting the recording material to form a color image and uniformly exposing to light to prevent undesired coloration; said light- and heat-sensitive recording material being a recording material comprising a support base having on one surface thereof a plurality of microcapsules containing a vinyl compound, a photopolymerization initiator, a first color forming component capable of undergoing a color reaction with a second component to form a color, and a solvent, and second color forming component wherein said solvent and said first color forming component are present in the core of said microcapsules and said second color forming component is present outside of said microcapsules.

12. A process for forming color images in a light- and heat-sensitive recording material as claimed in claim 11, wherein the vinyl compound contains a group selected from the groups consisting of an acryloyl group, a methacryloyl group, an allyl group, an unsaturated polyester group, a vinyloxy group, and an acrylamido group.

13. A process for forming color images in a light- and heat-sensitive recording material as claimed in claim 12, wherein the vinyl compound is present in the capsule in an amount of about 10 to 90 wt %.

14. A process for forming color images in a light- and heat-sensitive recording material as claimed in claim 11, wherein the photopolymerization initiator is selected from the group consisting of aromatic ketones, quinone compounds, ether compounds and nitro compounds.

15. A process for forming color images in a light- and heat-sensitive recording material as claimed in claim 14, wherein the photopolymerization initiator is present in an amount of 0.1 wt % to 30 wt % based on 100 percent by weight of the vinyl compound.

16. A process for forming color images in a light- and heat-sensitive recording material as claimed in claim 11, wherein the first color forming component is a color former and the second color forming component is a color developer.

17. A process for forming color images in a light- and heat-sensitive recording material as claimed in claim 11, wherein the first color forming component is present in the microcapsule in a concentration in the range of 0.1 to 50 wt %.

18. A process for forming color images in a light- and heat-sensitive recording material as claimed in claim 15, wherein the first color forming component is present in the microcapsule in a concentration in the range of 0.1 to 50 wt %.

19. A process for forming color images in a light- and heat-sensitive recording material as claimed in claim 16, wherein the color former is present in an amount of 0.05 to 1.5 g/m² and the color developer is present in an amount in the range of 0.5 to 4.0 g/m².

20. A process for forming color images in a light- and heat-sensitive recording material as claimed in claim 18, wherein the color former is present in an amount in the range of 0.05 to 0.4 g/m² and the color developer is present in an amount in the range of 0.5 to 2.0 g/m².

21. A light- and heat-sensitive recording material as claimed in claim 1, said solvent comprising at least one oil.

22. A process for forming color images in a light- and heat-sensitive recording material as claimed in claim 11, said solvent comprising at least one oil.

* * * * *